United States Patent [19]
Schroeder

[11] Patent Number: 5,393,350
[45] Date of Patent: Feb. 28, 1995

[54] THERMOELECTRIC GENERATOR AND MAGNETIC ENERGY STORAGE UNIT

[76] Inventor: Jon M. Schroeder, 1430 Bagdad Rd., Leander, Tex. 78641

[21] Appl. No.: 133,348

[22] Filed: Oct. 8, 1993

[51] Int. Cl.[6] .................................. H01L 35/32
[52] U.S. Cl. ................................ 136/205; 136/211; 136/212; 136/217; 136/218; 136/224; 136/242
[58] Field of Search ............... 136/200, 205, 207, 208, 136/209, 210, 211, 212, 217, 218, 219, 220, 224, 225, 242; 310/306, 307

[56] References Cited

U.S. PATENT DOCUMENTS

| | | | |
|---|---|---|---|
| 2,390,578 | 12/1945 | Findley | 136/4 |
| 2,410,872 | 11/1946 | Findley | 136/4 |
| 2,415,005 | 1/1947 | Findley | 136/4 |
| 2,425,647 | 8/1947 | Sarver | 171/97 |
| 2,864,879 | 12/1958 | Toulmin, Jr. | 136/4 |
| 2,919,553 | 1/1960 | Fritts | 62/3 |
| 3,090,875 | 5/1963 | Harkness | 310/4 |
| 3,119,939 | 1/1964 | Von Koch | 310/4 |
| 3,326,727 | 6/1967 | Fritts | 136/208 |
| 4,859,250 | 8/1989 | Buist | 136/225 |
| 5,022,928 | 6/1991 | Buist | 136/212 |
| 5,168,118 | 12/1992 | Schroeder | 89/8 |

Primary Examiner—Donald P. Walsh
Assistant Examiner—Chrisman D. Carroll
Attorney, Agent, or Firm—Joseph F. Long

[57] ABSTRACT

A low voltage high amperage thermopile generating and electron storage unit is disclosed wherein current is formed by heating and cooling alternate junctions of dissimilar metals arranged in a circular fashion and may be enhanced with an electrical flux pump. Current may be withdrawn using an ultra fast thermopile type switch to connect to an electrical load source.

4 Claims, 3 Drawing Sheets

THERMOELECTRIC GENERATOR AND MAGNETIC ENERGY STORAGE UNIT

BACKGROUND OF THE INVENTION

This invention was made with Government support under contract number DASG60-93-C-0145. awarded by Department of Defense, Ballistic Missile Defense Organization (BMDO), managed by the U.S. Army Space and Strategic Defense Command. The Government has certain right in the invention.

There continues to be a need to store electricity as evidenced by work being done to produce better batteries and by necessity for power companies to either limit peak power usage or have extra generating capacity instantly available. This invention covers a unit for thermal generation and unique method of storage of electricity in the same unit. This unit may be economically feasible in many applications.

It is well known that a thermocouple, which is comprised of two dissimilar metals connected together, generates a measurable potential that varies with temperature. It is also known that heating and cooling alternate junctions of pairs of particular dissimilar metals held in intimate contact produces a current. We have chosen to use copper and nickel in most of our experimental work but nickel and aluminum and other pairs of dissimilar metals are also usable. We have found that a ring formed by segments of these dissimilar metals with heated and cooled junctions cause a high amperage but low voltage current to circulate in the ring.

The closest prior art that we have found is Schroeder, U.S. Pat. No. 5,168,118 issued Dec. 1, 1992. The present invention differs significantly as follows:
   a) improved shapes of copper and nickel segments to produce current by heating and cooling alternate junctions are used,
   b) we can use a stepwise build up of current by induction or injection while heating and cooling alternate junctions to maintain the apparent conductivity of the ring orders of magnitude greater than copper or nickel, and
   c) a unique thermoelectric switch with an apparent zero resistance under generation as pan of the ring formed with copper and nickel segments.

The switch is formed with multiple removable nickel plugs, preferably with gold plated seats closely fitting into adjacent segments formed by separating one of the copper segments that make up the generating and storage ring of this invention. The nickel plugs may be displaced by impact to open or close the switch in microseconds. This very rapid opening is necessary to remove maximum current generated by collapsing electromagnetic field when the switch is opened.

Experimental work has shown with the thermoelectric switch formed in one of the dissimilar segments shaped to form a ring that current will flow in the ring as long as the junctions of the segments are alternately heated and cooled. Heating may be by exhaust gas from a combustion engine, electric heaters, open flames, high pressure steam, etc. Cooling may be by air, chilled water, refrigerated gas, etc. Apparently generated current is dependent on the temperature difference or delta T at the junctions with the temperature level having a much lesser influence. We also found that current flowing in the ring and therefore the magnetic field may be greatly enhanced by induction or by injection of current. We inject current by electrically connecting leads from a voltage source on opposite sides of the generating ring and rapidly closing and opening a switch in one of the leads. This action pulses current into the current already circulating. This is easily done since the generated current is less than one volt. With significant injection of current the apparent superconductivity disappears. However the electrical resistance through the heated junctions is less than one tenth the resistance expected from copper. The higher circulating current is maintained as long as a pulse injection continues. We have not thoroughly investigated but the higher current caused by injection does not instantly collapse upon cessation of pulsing allowing adequate switching time. We expect that a generating ring with pulsed injection may allow use of this system to do many of the things visualized by using superconducting compositions. These would include levitation of trains, enhanced used of nuclear magnetic resonance etc. Other uses suggested in visionary discussions of superconductivity such as electrical storage to supply peak power of a very short duration may also be possible by switching developments starting with the zero resistivity thermoelectric switch as outlined. A tank mounted railgun would appear to be feasible since current could be continuously injected from the tank alternator and the motor exhaust gas could be used to generate the necessary junction delta T.

By arranging the dissimilar metal segments to form two split tings connected with dissimilar metal segments, also with heated and cooled junctions, current will flow continuously and the magnetic fields tend to cancel each other. By using a Colpitts oscillator or similar unit for current injection the frequency of the oscillating current may be built up to the point that energy is given off in waves. With further development transmission to a satellite and reflection back may be a viable form of electrical transmission.

We expect further development of use of different metals, different shapes, programmed injection or induction of current and in switching. We wish therefore to only be limited to the general purpose and spirit of this invention as outlined in this claims and specifications rather than specific details.

SUMMARY OF THE INVENTION

The invention comprises:
   a) a low voltage generating unit formed by alternate segments of dissimilar metals arranged in circular form with heating and cooling of alternate junctions causing a low voltage but high current flow, current flow being dependent upon temperature gradient of the junctions and size of the unit,
   b) a method of sustaining and enhancing current flow by low voltage injection of current by direct connection or a pulse current induction by an induction coil,
   c) an essentially zero resistance thermoelectric switch operable in microseconds and
   d) output leads on either side of the thermoelectric switch.

The voltage generated by heating, and cooling junctions of dissimilar metals such as nickel and copper or nickel and aluminum is less than one volt but with properly shaped dissimilar metal segments arranged in a ring fashion with junctions heated and cooled there is a large current flow. With current enhancement a very high current with relatively slow decay rate and producing a high strength magnetic field is possible.

The thermoelectric switch may be formed by drilling tapered holes in the center pillar of one of the copper segments; sawing a slot through the segment; fitting tapered nickel plugs to electrically connect the segments through the nickel plugs; heating and cooling alternate sides of the copper segment; arranging a solenoid driven impact device to unseat the nickel plugs; and output connections to an electrical load on either side of the slot in the copper segment. The collapsing magnetic field generates voltage to drive the current flow even into a high voltage load. Conventional switching may be used in the leads to the electrical load. In order to return power to a utility grid switching in the leads to the electrical load or grid would require switches to operate in concert with the 60 cycle voltage on the grid. We would expect a large loss in this use. Switching to use the current generated by the collapsing field to operate a rail gun would be quite simple since the thermoelectric switch alone would be used.

In another embodiment two split rings formed by dissimilar metal segments and joined with two dissimilar metal segments with provisions for heating and cooling alternate junctions are placed one above the other. With a Colpitts oscillator or a similar oscillation device connected to the dissimilar metal segments joining the split rings current at a high enough frequency to emit electromagnetic waves may be added. These waves may be beamed to outer space and reflected back to a receiver as a way of electrical transmission.

Preferred construction in both embodiments is of segments of nickel and segments of copper formed to maximize junction area, equalize electrical conductivity and form heating and cooling passageways to heat and cool alternate junctions.

In a preferred embodiment air is blown into an air inlet cooling manifold attached to alternate junctions of the segmented ring. An air exit cooling manifold allows heated exit air to supply air to multiple gas burners in an inlet heating manifold connected to heat alternate junctions of the segmented ring. An exit heating manifold is connected to a short stack or inlet of a heated air discharge fan to pull heated gas exit the burners through the heated air passageways to heat the alternate junctions of the segmented ring.

This invention should allow performance of many functions visualized for cryogenically cooled superconducting materials with possible improvement in energy usage by utilizing waste heat for the thermopile as compared to cryogenic cooling to produce a superconductive unit.

DETAILED DESCRIPTION OF THE INVENTION

We may best describe the invention from the drawings.

Figure 1:
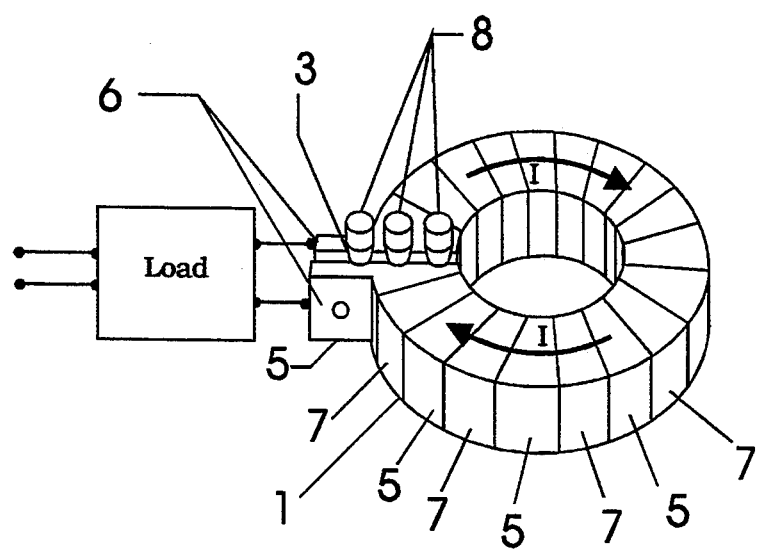
FIG. 1 shows schematics indicating shape of segmented units and thermoelectric switch integrally formed in the unit.
Figure 4:
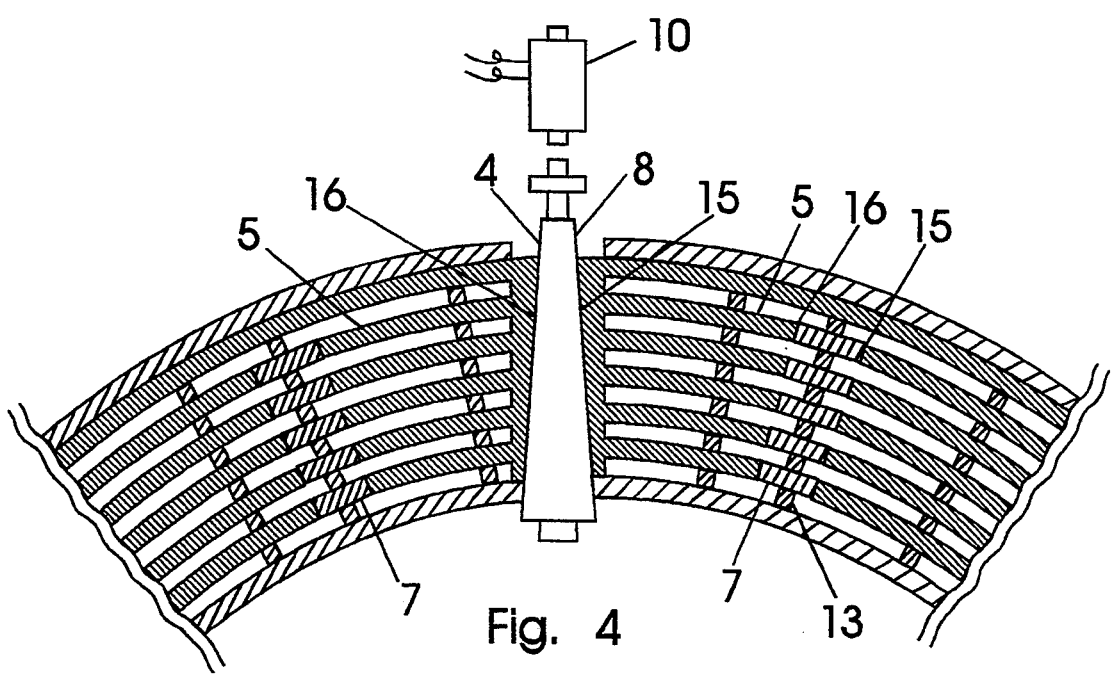
FIG. 4 shows a segment separated to form a thermoelectric switch.

In FIG. 1 we've shown a ring structure 1 composed of segments 5 and segments 7 of dissimilar metals alternating with each other. We've shown a thermoelectric switch 3 formed by modifying one of the segments to have heavy duty output leads 6 as an integral part of the ring. In the preferred embodiment segments 5 are copper and segments 7 are nickel. The switch 3 shown in more detail in FIG. 4 is made by drilling tapered holes in a modified segment 5 and sawing a slot to form an open switch. The switch is closed by insertion of tapered nickel plugs 8. In a closed position there is a cold junction 15 on one side of the nickel plugs and a hot junction 16 on the other. The switch 3 will then act as another pair of segments of the ring.

Figure 2:
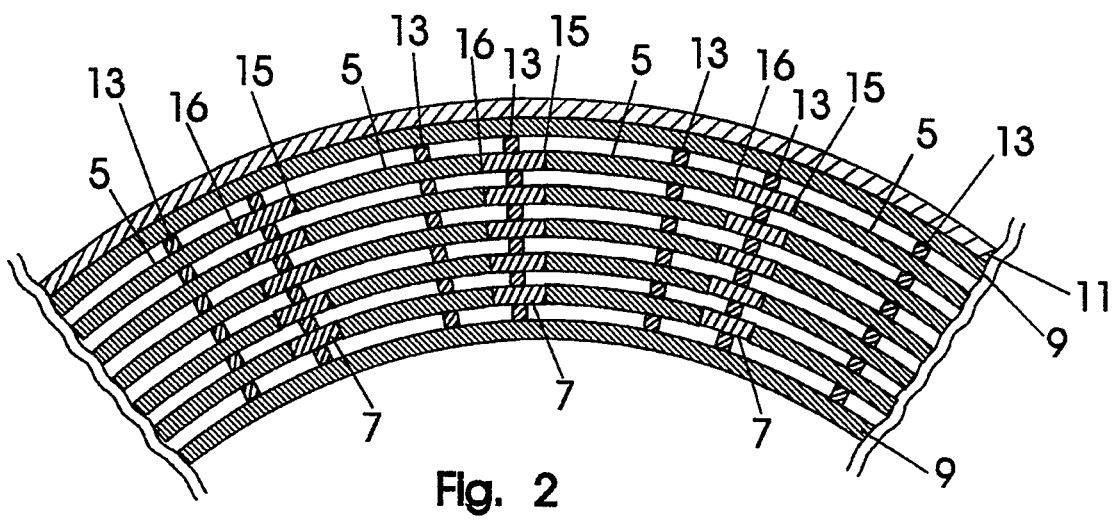
FIG. 2 shows a segment of a ring shaped unit, indicating re-enforcement and shape of metal segments.
Figure 5:
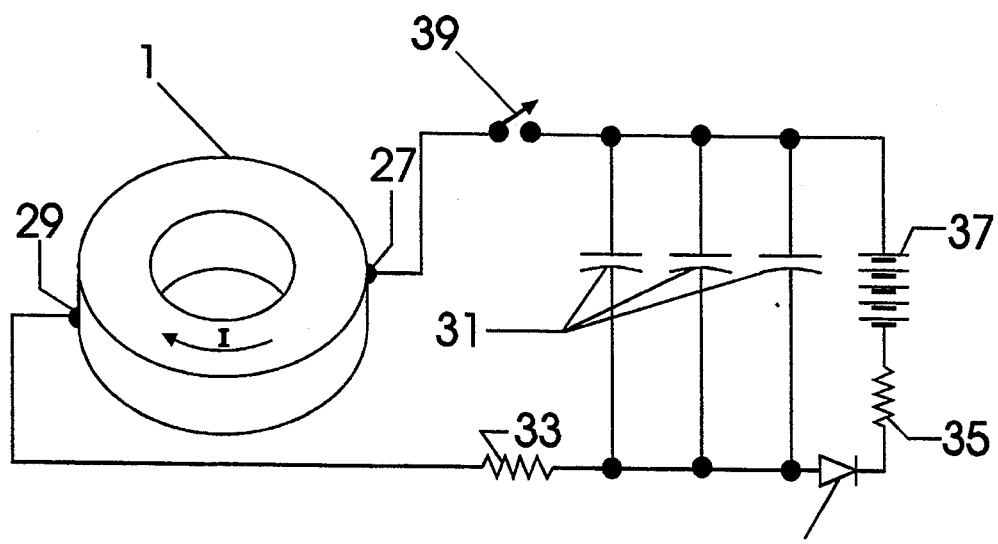
FIG. 5 shows a flux pump for current injection.

In FIG. 2 we've shown a section of ring 1 indicating alternating copper segments 5 with nickel segments 7 with gasketted ceramic spacer blocks 13 separating copper and nickel strips. Junctions 15 and 16 between the copper and nickel may be made by conventional methods of brazing, welding, etc. Since copper is more conductive than nickel we use greater lengths of copper than nickel in one preferred embodiment. Gasketted spacers 13 are located midway of nickel segments 7 and spaced below copper segments 5 to allow greater area for heating than for cooling. The ring formed as described is preferably contained in a ceramic shell 9. Teflon ® or ceramic side-plates (not shown), may be used to complete the shell. In operation, with a temperature difference between junctions of about 300° C. we calculate from experimental data determined in our laboratory and confirmed by an independent testing agency that with a ring of an internal diameter of 82" inches and an external diameter of 94" and having a rectangular cross section of 6"×8" that a voltage of 0.002 to 0.02 volts and an amperage of 500,000 to 1,000,000 amps will be generated. This flowing current should give a magnetic field of 10 to 20 tesla. By adding currents by injection as shown in FIG. 5 we calculate that we can increase current flow to give a magnetic field approaching 26 tesla. With the very strong magnetic fields the ring must be re-inforced. Re-inforcing with multiple windings of heated and stressed Kevlar ® 11 will be used.

In another embodiment (not shown) junctions of alternating copper and nickel segments may be formed by interlocking finger-like projections.

Figure 3:
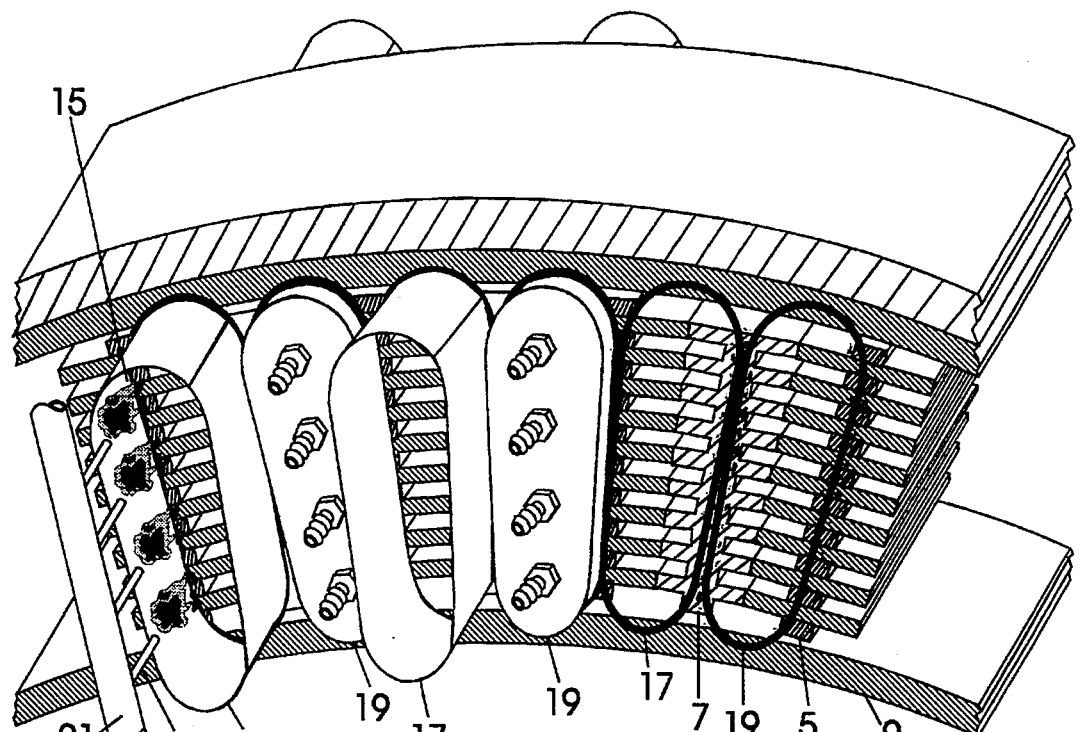
FIG. 3 shows a segment of the ring shaped unit with heating and cooling manifolds.

In FIG. 3 we've shown a portion of ring 1, FIG. 1 with side manifolds 17 and 19. Manifold 17 contains multiple natural gas burners 23 with combustion gas exit the burners heating the hot junction segments. A combustion gas exit manifold is equipped with an in line fan to hold a slight negative pressure at burners 23. In other embodiments the combustion gas may be returned back and forth to heat two or more of the "hot" junctions. Manifold 19 may be used to carry refrigerant gas, cooling water or cooling air. The engineering choice will depend upon many factors such as site location, water availability etc. At any rate in a preferred embodiment in large installations cooling air will be used and the heated air collected in a manifold and a portion used to supply inlet air to burners 23. Operating in this fashion in some visualized installations supplying heated combustion gas to heat the hot junctions and cooling air to cool the cold junctions will allow the unit to operate as though it were a superconducting ring.

In FIG. 4 we've shown a copper segment 5 altered to have a central spline 4 of copper. A multiplicity of tapered holes are drilled through spline 4 and a slot is cut through the center of the holes to disconnect the two halves of the spline. Tapered nickel plugs 8 form an electrical connection with heated junctions 16 on one side and cooled junctions 15 on the other side of the plugs. The copper plug seat is preferably gold plated to prevent sticking. Activation of multi-solenoids 10 reacts the nickel plugs 8 to open the switch in milliseconds.

In FIG. 5 we've shown a type of flux pump circuit to inject electrons (current) into the circulating electron stream formed by heating and cooling junctions of the dissimilar metals in ring 1 as described. Battery 37 or any other D.C. voltage source will charge capacitors 31 and inject current into ring 1 through connectors 27 and 29 located on opposite sides of the ring when switch 39 is closed. Resistors 33 and 35 and diode 40 modulate the current flow. Switch 39 is pulsed to cause recharging of capacitors 31 and current injection into ring 1. In this way electron flow in ring 1 is increased with an attendant increase in magnetic field strength.

Experimental data, confirmed by an independent laboratory, on a small unit shows apparent electrical conductance of the ring 1 with heated and cooled junctions is 5 to 10 times greater than one would expect from either copper or nickel alone. Said another way we were able to achieve orders of magnitude more amperes flowing in the heated and cooled junction ring than would be expected. We do not have a theoretical explanation of why.

Current may be also added into the current circulating in ring 1 by inductance or by use of suitable circuitry and a transformer.

Figure 6:
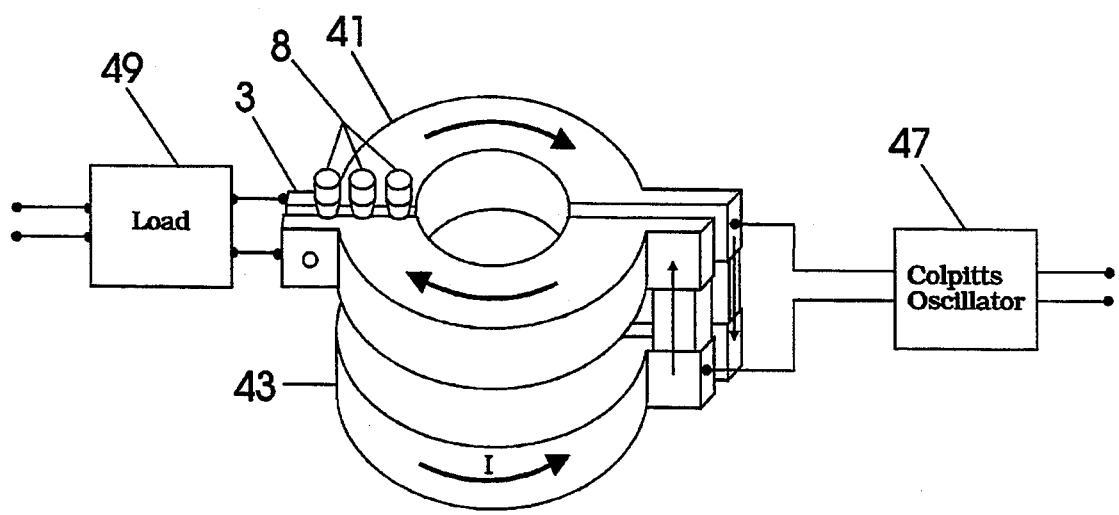
FIG. 6 shows a dual ring unit and oscillator to build current.

FIG. 6 shows a second embodiment. Split ring 41 and split ring 43 fabricated of segments of dissimilar metals and heated and cooled and reinforced as previously outlined are placed one above the other and connected together with dissimilar metals also with heated and cooled junctions. Current flows as shown by the arrows producing electromagnetic fields that appear to cancel each other. With Colpitts oscillator 47 or a similar oscillator a current with an order of magnitude frequency of $7 \times 10^7$ hertz may be obtained with resultant expelling of energy in the form of electromagnetic waves.

What is claimed:

1. A thermoelectric generator and magnetic energy storage unit comprising:
    a) a switch means operable in microseconds with integral output leads;
    b) multiple copper and multiple nickel segments connected on either side of said switch means; said copper and nickel segments being shaped to fit closely to form a multiplicity of rings;
    c) a metallic means between each of said copper and said nickel segments to form metallic junctions between each of said segments of copper and nickel;
    d) gasketted insulating type spacer means located between said metallic junctions of said rings to form multiple apertures to allow heating and cooling of said junctions;
    e) a heating means and cooling means in said multiple apertures to heat and cool alternate junctions of said metallic junctions; thereby causing current to flow and generate a magnetic field in said unit;
    f) a flux pump means with connections to inject additional current into said current flow thereby increasing strength of said magnetic field in said unit and current generated by collapsing of said magnetic field when a load is connected on either side of said switch means and said switch means is instantaneously opened.

2. A thermopile type electromagnetic generating and storage unit as in claim 1 wherein said flux pump means is an oscillator.

3. A thermoelectric generator and magnetic energy storage unit as in claim 1 wherein said flux pump means comprises a battery with capacitors in parallel between a first and a second lead from said battery, and a switch means operable at intervals in said first of said leads from said battery to a first connector on said ring with said second lead from said battery connecting with a second connector that is across said ring from said first connector.

4. A thermoelectric generator and magnetic energy storage unit comprising:
    a) multiple copper segments and multiple nickel segments with alternate segments of said copper segments and said nickel segments joined with a metallic bond and with heating and cooling means to heat and cool alternate junctions of said segments;
    b) a first and a second split ring means formed from said alternate segments with said first ring held in place above said second ring with openings to form said split rings aligned above each other;
    c) connection means formed from said copper and said nickel segments to connect said openings in said first ring and said second ring so that current in said second ring induced by heating and cooling alternate junctions of said copper and nickel segments flows in an opposite direction from said current in said first ring; said current in said first ring and said current in said second ring producing magnetic fields;
    d) an oscillator means connected with said connector means to cause an increasing oscillating current thereby increasing said magnetic fields in said first and second ring with said current reaching a frequency of an order of magnitude of $7 \times 10^7$ hertz; and
    e) a switching means operable in microseconds in said first ring, said switching means operating as a pair of said segments and generating current when in a closed position and operating to discharge current induced by collapsing of said magnetic field into a load connected on either side of said switch when said switch is instantaneously opened.

* * * * *